(12) United States Patent
Ito

(10) Patent No.: US 7,315,481 B2
(45) Date of Patent: Jan. 1, 2008

(54) SEMICONDUCTOR MEMORY

(75) Inventor: Shigemasa Ito, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 103 days.

(21) Appl. No.: 11/168,924

(22) Filed: Jun. 29, 2005

(65) Prior Publication Data

US 2006/0203588 A1 Sep. 14, 2006

(30) Foreign Application Priority Data

Mar. 9, 2005 (JP) ............................ 2005-065505

(51) Int. Cl.
*G11C 7/02* (2006.01)
(52) U.S. Cl. ............... 365/210; 365/189.09; 365/225.7
(58) Field of Classification Search ................ 365/210, 365/189.09, 225.7
See application file for complete search history.

(56) References Cited

U.S. PATENT DOCUMENTS

| 5,886,939 | A | 3/1999 | Choi et al. |
| 6,185,131 | B1 | 2/2001 | Kouchi |
| 6,515,933 | B2 * | 2/2003 | Tomioka ..................... 365/226 |

| 2003/0063493 | A1 | 4/2003 | Yokozeki |
| 2004/0190350 | A1 | 9/2004 | Wada |
| 2005/0041477 | A1 | 2/2005 | Lee et al. |

FOREIGN PATENT DOCUMENTS

| EP | 0 638 903 A2 | 8/1994 |
| JP | 10-144889 | 5/1998 |
| JP | 2000-339979 | 12/2000 |

* cited by examiner

*Primary Examiner*—Huan Hoang
(74) *Attorney, Agent, or Firm*—Arent Fox LLP

(57) ABSTRACT

When it is judged that real bit lines connected to real memory cells are liable to be connected to adjacent circuit elements to be electrically short-circuited, dummy bit lines are connected to voltage lines which supply voltages to the circuit elements. For example, the dummy bit lines are directly connected to a negative voltage line via a connection wiring line. Alternatively, the dummy bit lines are selectively connected to any one of internal voltage lines. Even when the dummy bit lines are connected to the adjacent circuit elements to be electrically short-circuited, a leak can be prevented from occurring between the dummy bit lines and the circuit elements. Since the leak can be prevented, internal voltage generators can be prevented from uselessly operating and a standby current can be prevented from increasing. As a result, the yield of the semiconductor memory can be enhanced.

16 Claims, 14 Drawing Sheets

SEMICONDUCTOR MEMORY

CROSS REFERENCE TO RELATED APPLICATION

This application is based upon and claim the benefit of priority from Japanese Patent Application No. 2005-065505, filed on Mar. 9, 2005, the entire contents of which are incorporated herein by reference.

BACKGROUND OF THE INVENTION

1. Field of the Invention

The present invention relates to a semiconductor memory having dummy bit lines.

2. Description of the Related Art

The density of elements or wiring lines in a memory cell array (real memory cell array) formed in a semiconductor memory is higher than that of a peripheral circuit which is provided outside the memory cell array. For this reason, at a boundary of a circumferential portion of the memory cell array and the peripheral circuit, the density (regularity) of the elements or wiring lines significantly changes. With the difference in the density, the circumferential portion is liable to be influenced by a halation in a photolithography process, which is one of fabrication processes of the semiconductor memory. With the halation, the shape of the memory cell or the wiring line in the circumferential portion is different from that of the memory cell or the wiring line in the memory cell array. The difference in shape causes a short failure or snap failure, thereby lowering the yield of the semiconductor memory.

Generally, in the semiconductor memory, in order to prevent the corruption of the element shape in the circumferential portion due to the halation, a dummy memory cell array is formed in the circumferential portion of the memory cell array. The dummy memory cell array has the same structure as that of the real memory cell array and includes dummy memory cells, a dummy word line, and a dummy bit line. The dummy memory cells are shape dummies and do not store write data. For this reason, typically, the dummy word line and the dummy bit line are connected to a precharge voltage, which is a normal voltage of a bit line.

In Japanese Unexamined Patent Application Publication No. 2000-339979, a virtually grounded nonvolatile semiconductor memory having dummy memory cells is disclosed. In the semiconductor memory, a dummy bit line connected to each dummy memory cell temporarily receives a negative voltage via a transistor so as to increase a threshold voltage of the dummy memory cell. Accordingly, a read margin of a real memory cell adjacent to the dummy memory cell is prevented from being lowered. However, after the threshold voltage of the dummy memory cell is increased, the dummy bit line becomes in a floating state. A bit line which continues to be in the floating state for a long time may change in accordance with the change in voltage of an adjacent wiring line (crosstalk). For this reason, a malfunction may occur due to the crosstalk.

In Japanese Patent Unexamined Patent Application Publication No. 10-144889, a DRAM in which contacts for connecting dummy bit lines, which are fixed to a precharge voltage, to dummy memory cells are not formed is disclosed. In the DRAM, the dummy bit lines are prevented from being connected to capacitors of the real memory cells to be electrically short-circuited via capacitors of the dummy memory cells, thereby preventing a leak failure. However, the dummy memory cells are basically formed so as to prevent the halation. For this reason, if the shape of the pattern of the dummy memory cells changes, the effect on the halation may be lowered.

In the semiconductor memory, such as the DRAM, or the like, there are many cases in which the dummy bit lines are fixed to the precharge voltage, that is, a resetting voltage of real bit lines through which data is output/input. On the other hand, with a minute element structure, the distance between adjacent wiring lines and the distance between the wiring lines and the elements tend to be small. For this reason, between the dummy bit lines and other wiring lines or between the dummy bit lines and the elements (transistors), the leak failure may easily occur. In addition, with the minute element structure, the cause for this type of the leak failure (failure places) may change even when the fabricating condition of the semiconductor changes somewhat. For this reason, the cause for the leak failure generated in the dummy bit lines may change between wafers in a lot or may change according to the position of a semiconductor memory chip in a wafer, as well as between fabricating lots.

The leak failure increases a standby current and thus lowers the yield. In particular, the specification of the standby current is further rigid to a semiconductor memory that is mounted on a hand-held terminal powered by a battery. In such a semiconductor memory, due to the increase in the standby current, the yield may be significantly lowered.

SUMMARY OF THE INVENTION

It is an object of the invention to provide a semiconductor memory that can reduce a standby current caused by dummy bit lines and that can enhance yield.

According to a first aspect of the invention, a semiconductor memory includes real memory cells that hold write data and dummy memory cells that do not hold write data. Dummy bit lines are connected to the dummy memory cells. A negative voltage generator generates a negative voltage, which is used in an internal circuit of the semiconductor memory, according to an external supply voltage. Circuit elements supplied with the negative voltage are formed neighboring to the dummy bit lines. The dummy bit lines are directly connected to a negative voltage line, to which the negative voltage is supplied, via a connection wiring line. For example, when it is judged that real bit lines connected to the real memory cells are liable to be connected to adjacent circuit elements to be electrically short-circuited due to a change in fabricating condition of the semiconductor memory, the dummy bit lines are also liable to be connected to the adjacent circuit elements to be electrically short-circuited. In accordance with the first aspect of the invention, even when the dummy bit lines are connected to the adjacent circuit elements to be electrically short-circuited, a leak can be prevented from occurring between the dummy bit lines and the circuit elements. Since the leak can be prevented, the negative voltage generator can be prevented from operating unnecessarily, thereby preventing a standby current from increasing. As a result, the yield of the semiconductor memory can be enhanced.

In the semiconductor memory according to the first aspect of the invention, it is preferable that the negative voltage generated by the negative voltage generator is a substrate voltage of a dummy transistor formed in each of the dummy memory cells. When it is judged that the real bit lines connected to the real memory cells are liable to be connected to the substrate of the transistors constituting the real memory cells to be electrically short-circuited, the dummy bit lines are also liable to be connected to the substrate of the dummy transistors to be electrically short-circuited. In accordance with the above-described configuration, even when the dummy bit lines are connected to the substrate of the dummy transistors to be electrically short-circuited, a leak can be prevented from occurring between the dummy bit lines and the substrate of the dummy transistors. As a result, the standby current can be prevented from increasing and thus the yield of the semiconductor memory can be enhanced.

In the semiconductor memory according to the first aspect of the invention, it is preferable that the negative voltage generated by the negative voltage generator is a resetting voltage which is supplied to real word lines sodas to turn off real transistors formed in the real memory cells. When it is judged that the real bit lines are liable to be connected to the real word lines to be electrically short-circuited, the dummy bit lines are also liable to be connected to the real word lines to be electrically short-circuited. In accordance with the above-described configuration, even when the dummy bit lines are connected to the real word lines to be electrically short-circuited, a leak can be prevented from occurring between the dummy bit lines and the real word lines. In particular, since all real word lines are held to the resetting voltage during standby, during the power-on of the semiconductor memory, the resetting voltage is supplied for a long time. As a result, the standby current can be prevented from increasing and thus the yield of the semiconductor memory can be enhanced.

According to a second aspect of the invention, a semiconductor memory includes real memory cells that hold write data and dummy memory cells that do not hold write data. Dummy bit lines are connected to the dummy memory cells. A plurality of internal voltage generators generates multiple types of internal voltages, which are used in an internal circuit of the semiconductor memory, according to an external supply voltage. Circuit elements supplied with the internal voltages are formed neighboring to the dummy bit lines. A connection setting circuit connects the dummy bit lines to any one of a plurality of internal voltage lines to which the internal voltages are respectively supplied. In accordance with the second aspect of the invention, the dummy bit lines can be connected to the internal voltage lines which supply the internal voltage to the circuit elements, which are liable to be connected to the dummy bit lines to be electrically short-circuited. The change of the connection can be made for each semiconductor memory. Therefore, even when the circuit elements, which are liable to be electrically short-circuited, are changed into other circuit elements due to the change in the fabricating condition of the semiconductor memory, the dummy bit lines can be easily connected to additional internal voltage lines according to the change. As a result, even when a main failure category is changed due to the change of the fabricating condition, the standby current can be prevented from increasing and thus the yield of the semiconductor memory can be enhanced.

In the semiconductor memory according to the second aspect of the invention, it is preferable that the connection setting circuit has a programming circuit and a switch circuit. In the programming circuit, information indicating the internal voltage line to be connected to the dummy bit line may be programmed in advance. The switch circuit may connect the dummy bit lines to any one of the internal voltage lines according to the programmed state of the programming circuit. By providing the programming circuit, in the fabrication process of the semiconductor memory, information indicating the internal voltage lines can be easily programmed.

In the semiconductor memory according to the second aspect of the invention, it is preferable that the programming circuit has a fuse circuit that has fuses in which information is programmed according to a blown or an unblown state and that outputs a signal at a predetermined logical level. The switch circuit may be connected to any one of the internal voltage lines according to the logical level. By constituting the programming circuit with the fuses, in the fabrication process of the semiconductor memory, the information indicating the internal voltage lines can be programmed by using the existing equipment. For this reason, in accordance with the above-described configuration, the increase in cost of the semiconductor memory can be prevented.

In the semiconductor memory according to the second aspect of the invention, it is preferable that a command decoder decodes an external command. When the external command decoded by the command decoder is a connection setting command, the switch circuit may connect the dummy bit lines to any one of the internal voltage lines according to a connection specification indicated by the connection setting command, regardless of the programmed state of the programming circuit. For this reason, before and after programming, the dummy bit lines can be connected to an arbitrary internal voltage line, regardless of the programmed state. For example, by using the command decoder before programming, it can be evaluated how the programming circuit should be programmed. By using the command decoder after programming, the failure cause of the semiconductor memory in which the failure is detected after manufacturing can be evaluated in detail.

For example, when receiving a predetermined combination of multiple types of operation commands open to the user of the semiconductor memory, the command decoder recognizes the connection setting command. Alternatively, when receiving a test command which is not open to the user, the command decoder recognizes the connection setting command. The connection specification is determined, for example, by at least one of an external address signal and an external data signal, which are supplied together with the connection setting command.

In the semiconductor memory according to the second aspect of the invention, it is preferable that the connection setting circuit is constituted by a conductive film which is formed on a semiconductor substrate to correspond to the pattern shape of a photo mask to be used for the semiconductor fabrication process and which connects any one of the internal voltage lines to the dummy bit lines. When the change in the fabricating condition of the semiconductor memory and the relationship between the real bit lines and the dummy bit lines, and the circuit elements to which the real bit lines and the dummy bit lines are liable to be connected to be electrically short-circuited are judged, by changing the conductive film (photo mask) to be formed according to the change in the fabricating condition, the yield of the semiconductor memory can be enhanced.

According to the first aspect of the invention, there is provided a method of fabricating a semiconductor memory. In order to fabricate the semiconductor memory according to the above-described second aspect of the invention, in a wafer test process, electrical characteristics of an evaluation circuit which is formed on a wafer near a semiconductor memory chip are evaluated. Next, in a programming process, a programming circuit is programmed according to the evaluation result in the wafer test process. For example, the programming process is a fuse process of allowing fuses formed in the programming circuit to be blown/unblown. In accordance with the third aspect of the invention, the dummy bit lines can be connected to a desired internal voltage line according to the electrical characteristics of the semiconductor memory for each semiconductor memory chip. As a result, the yield of the semiconductor memory can be enhanced.

According to the second aspect of the invention, there is provided a method of fabricating a semiconductor memory. In order to fabricate the semiconductor memory according to the above-described second aspect of the invention, in a shipment test process, it is judged whether a semiconductor memory chip formed on a wafer is good/bad. In a programming process, a programming circuit is programmed according to a failure category of a bad chip judged in the shipment test process. For example, the programming process is a fuse process of allowing fuses formed in the programming circuit to be blown/unblown. In accordance with the fourth aspect of the invention, the dummy bit lines can be connected to a desired internal voltage line according to the distribution of the failure categories of the semiconductor memory for each semiconductor memory. As a result, the yield of the semiconductor memory can be enhanced.

BRIEF DESCRIPTION OF THE DRAWINGS

The nature, principle, and utility of the invention will become more apparent from the following detailed description when read in conjunction with the accompanying drawing in which like parts are designated by identical reference numbers, in which.

DESCRIPTION OF THE PREFERRED EMBODIMENTS

Figure 1:
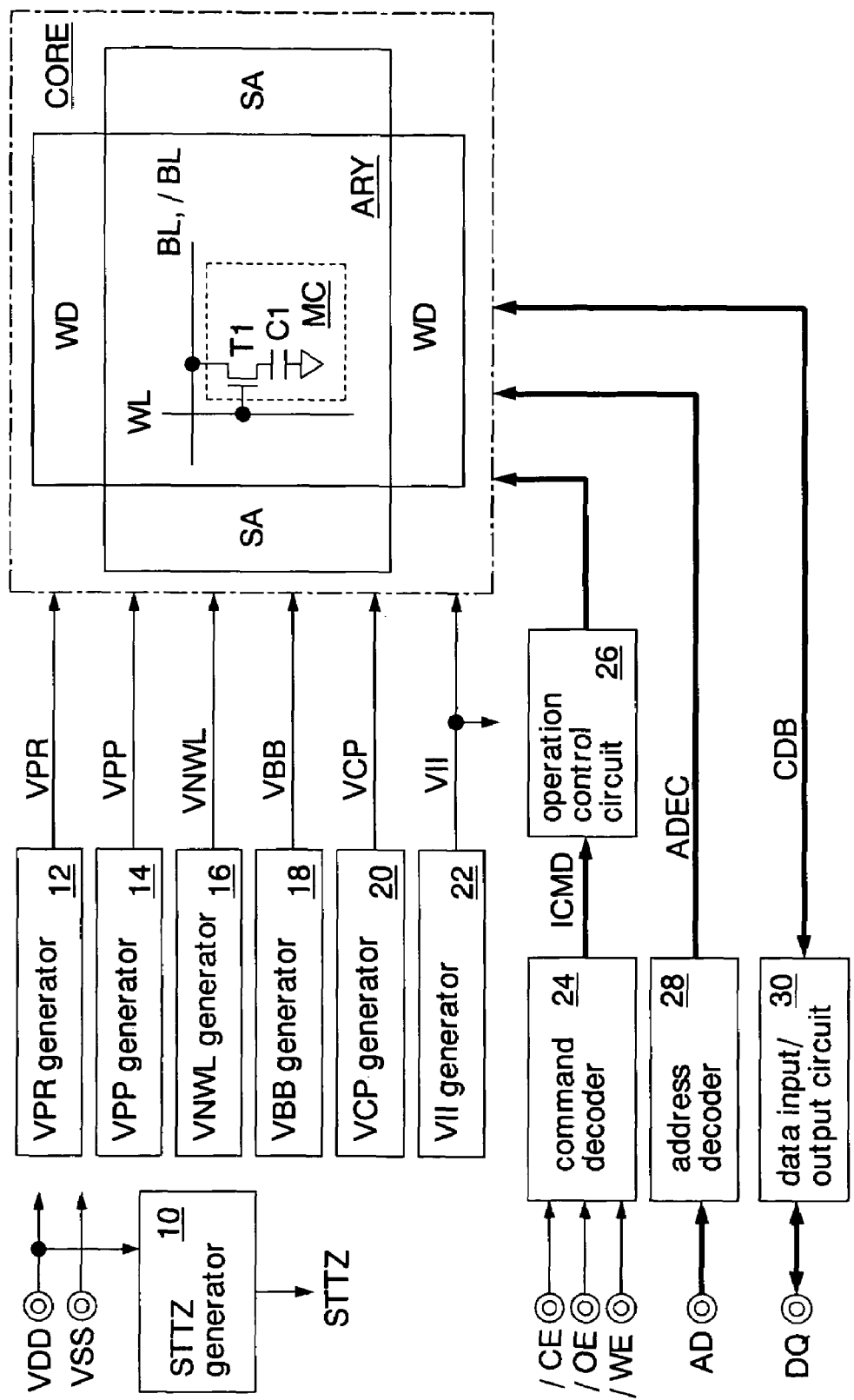
FIG. 1 is a block diagram showing a semiconductor memory according to a first embodiment of the invention.

Hereinafter, embodiments of the invention will be described with reference to the drawings. In the drawings, a double-circle denotes an external terminal. In the drawings, a signal line indicated by a thick line is constituted by a plurality of lines. Further, a portion of a block to which the thick line is connected is constituted by a plurality of circuits. A signal having a suffix of "Z" represents a positive logic and a signal having a prefix of "/" represents a negative logic. A signal line to which a signal is transferred is indicated by the same reference numeral as the name of the signal.

FIG. 1 shows a semiconductor memory according to a first embodiment of the invention. The semiconductor memory is formed, for example, as an FCRAM (Fast Cycle RAM) by using a CMOS process technology. The FCRAM is a type of a pseudo SRAM which has a DRAM memory core and an SRAM interface. In particular, the FCRAM is designed to be mounted on a hand-held terminal powered by a battery and has a low standby current. Specifically, the specification (test specification) of the standby current in the FCRAM is rigid.

The FCRAM has a STTZ generator 10, a VPR generator 12, a VPP generator 14, a VNWL generator 16 (negative voltage generator), a VBB generator 18 (negative voltage generator), a VCP generator 20, a VII generator 22, a command decoder 24, an operation control circuit 26, an address decoder 28, a data input/output circuit 30, and a memory core CORE.

The STTZ generator 10 (power-on reset circuit) outputs a starter signal STTZ (positive pulse signal) when an external supply voltage VDD (for example, 1.8 V) is lower than a predetermined voltage. The starter signal STTZ is supplied to a latch and the like which is to be initialized and sets these circuits to initial states. With the starter signal STTZ, after being powered on, the FCRAM is set in a reset state, until the external supply voltage VDD becomes the predetermined voltage, thereby preventing a malfunction.

The VPR generator 12 generates a precharge voltage VPR (for example, 0.8 V) to precharge bit lines BL and /BL described below by using the supply voltage VDD. The VPP generator 14 generates a boost voltage VPP (for example, 3 V), which is a high-level voltage (activation level) of a word line WL described below, by using the supply voltage VDD. The VNWL generator 16 generates a resetting voltage VNWL (for example, −0.4 V), which is a resetting voltage (inactivation level) of the word line WL, by using the supply voltage VDD.

The VBB generator 18 generates a substrate voltage VBB (for example, −0.4 V), which is supplied to a semiconductor substrate and a p-well region of memory cells MC described below of the FCRAM, by using the supply voltage VDD. The VCP generator 20 generates a cell plate voltage VCP (for example, 0.8 V), which is supplied to a common electrode of memory cell capacitors C1 described below, by using the supply voltage VDD. The VII generator 22 generates an internal supply voltage VII (for example, 1.6 V), which is supplied to internal circuits (mainly logical circuits), such as the command encoder 24, the operation control circuit 26, or the like, by using the supply voltage VDD. The precharge voltage VPR, the boost voltage VPP, the resetting voltage VNWL, the substrate voltage VBB, the cell plate voltage VCP, and the supply voltage VII are constant, without depending on the change in the value of the supply voltage VDD.

The VPR generator 12, the VPP generator 14, the VCP generator 20, and the VII generator 22 operate to generate the voltages only when the voltages VPR, VPP, VCP, and VII are lower than the expected values (for example, 0.8 V, 3 V, 0.8 V, and 1.6 V) and to raise the voltages VPR, VPP, VCP, and VII up to the expected values. The VNWL generator 16, the VBB generator 18 operate to generate the voltages only when the voltages VNWL and VBB are higher than the expected values (for example, −0.4 V) and to fall the voltages VNWL and VBB up to the expected values. When the voltages VPR, VPP, VCP, VII, VNWL, and VBB have the expected values, the generators 12, 14, 16, 18, 20, and 22 do not perform the generation operations of the voltages, and thus power consumption of them becomes small.

The command decoder 24 receives a chip enable signal /CE, an output enable signal /OE, and a write enable signal /WE as a command, decodes the received command, and outputs the decoded command as an internal command signal ICMD (write command and read command) to the operation control circuit 26. The operation control circuit 26 generates timing signals to execute a read operation, a write operation, and a refresh operation, according to the internal command signal ICMD supplied from the command decoder 24. When the read command (or the write command) and a refresh command generated in the FCRAM conflict with one another, the operation control circuit 26 has an arbiter (not shown) which determines priorities of these commands. The refresh command is periodically generated by a refresh timer (not shown).

The address decoder 28 decodes an external address signal AD which is supplied via an address terminal AD and outputs a decode signal ADEC to the memory core CORE. The FCRAM adopts an address nonmultiplexing method in which a row address signal and a column address signal are simultaneously received. At the time of the read operation, the data input/output circuit 30 outputs read data, which is transferred from the memory core CORE via a common data bus CDB, to an external data terminal DQ (for example, 8 bits). At the time of the write operation, the data input/output circuit 30 receives write data via the external data terminal DQ and transfers the received external data signal to the memory core CORE via the common data bus CDB.

The memory core CORE has a memory cell array ARY, word decoders WD, sense amplifiers SA, and a column decoder (not shown). The memory cell array ARY has a plurality of memory cells MC, each including a transfer transistor T1 and a capacitor C1, word lines WL, each being connected to a gate of the transfer transistor T1 of each of the memory cells MC, and bit lines BL (or /BL), each being connected to a data input/output node of the transfer transistor T1.

The word decoder WD selects any one of the word lines WL according to the row decoded signal of the decoded signal ADEC. To the selected word line WL, the boost voltage VPP is supplied. Further, to the non-selected word lines, the resetting voltage VNWL is supplied. The sense amplifier SA has sense amplifiers and column switches (not shown). For example, at the time of the read operation, the sense amplifier amplifies the signal amount of data read out from the memory cell MC via the bit line BL (or /BL). The column switch transfers read data on the bit line BL to the data input/output circuit 30 via the common data bus CDB and transfers write data, which is supplied via the common data bus CDB, to the bit line BL (or /BL). The column decoder (not shown) outputs a control signal to control the column switch according to the column decoded signal of the decoded signal ADEC.

Figure 2:
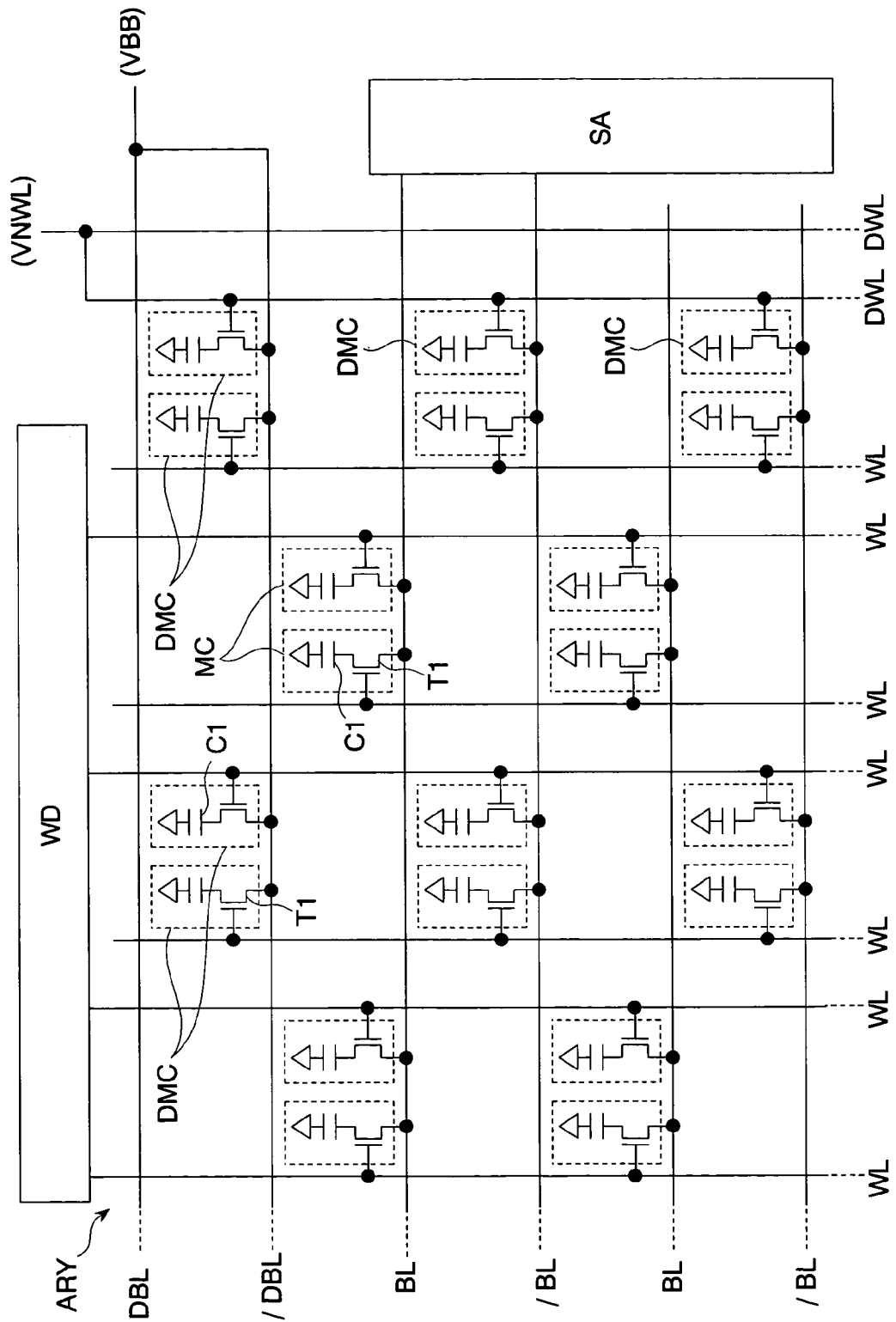
FIG. 2 is a circuit diagram showing the details of a memory cell array shown in FIG. 1.

FIG. 2 shows the details of a memory cell array ARY shown in FIG. 1. The memory cell array ARY has a plurality of memory cells MC that are arranged in a matrix shape, a plurality of real word lines WL that are wired in a longitudinal direction in the drawing, and a plurality of real bit lines BL and /BL that are wired in a traverse direction in the drawing. In a circumferential portion of the memory cell array ARY, a pair of dummy bit lines DBL and /DBL along a pair of real bit lines BL and /BL and two dummy word lines DWL along the real word line WL are formed. The layouts (the interval between the wiring lines, the width of the wiring line, and the like) of the dummy bit lines DBL and /DBL and the dummy word lines DWL are the same as those of the real bit lines BL and /BL and the real word line WL, respectively. To the dummy bit line /DBL, dummy memory cells DMC having the same structure as that of the real memory cell MC are connected. To the dummy word line DWL near the real memory cells MC, the dummy memory cells DMC are connected. Like the real memory cell MC, the dummy memory cell DMC has a transfer transistor T1 (dummy transistor) and a capacitor C1 (dummy capacitor). The real memory cell MC holds write data which is supplied via the external data terminal DQ. The dummy memory cell DMC does not hold write data.

In the present embodiment, the dummy bit lines DBL and /DBL are connected to a substrate voltage line VBB. The dummy word lines DWL are connected to a resetting voltage line VNWL. The real word lines WL are alternately connected to an upper word decoder WD and a lower word decoder (not shown) in the drawing. The pair of real bit lines BL and /BL are alternately connected to a right sense amplifier SA and a left sense amplifier (not shown) in the drawing. For example, at the time of the read operation, one of the real word lines WL is selected according to the address signal AD. The selected real word line WL turns on the real transfer transistor T1 of the real memory cell MC corresponding to one bit line (for example, BL) of the pair of real bit lines BL and /BL. The sense amplifier SA amplifies the voltage difference between the charge (read voltage) on the real bit line BL read out from the real capacitor C1 of the real memory cell MC via the real transfer transistor T1 and the precharge voltage VPR of the real bit line /BL to generate read data.

Figure 3:
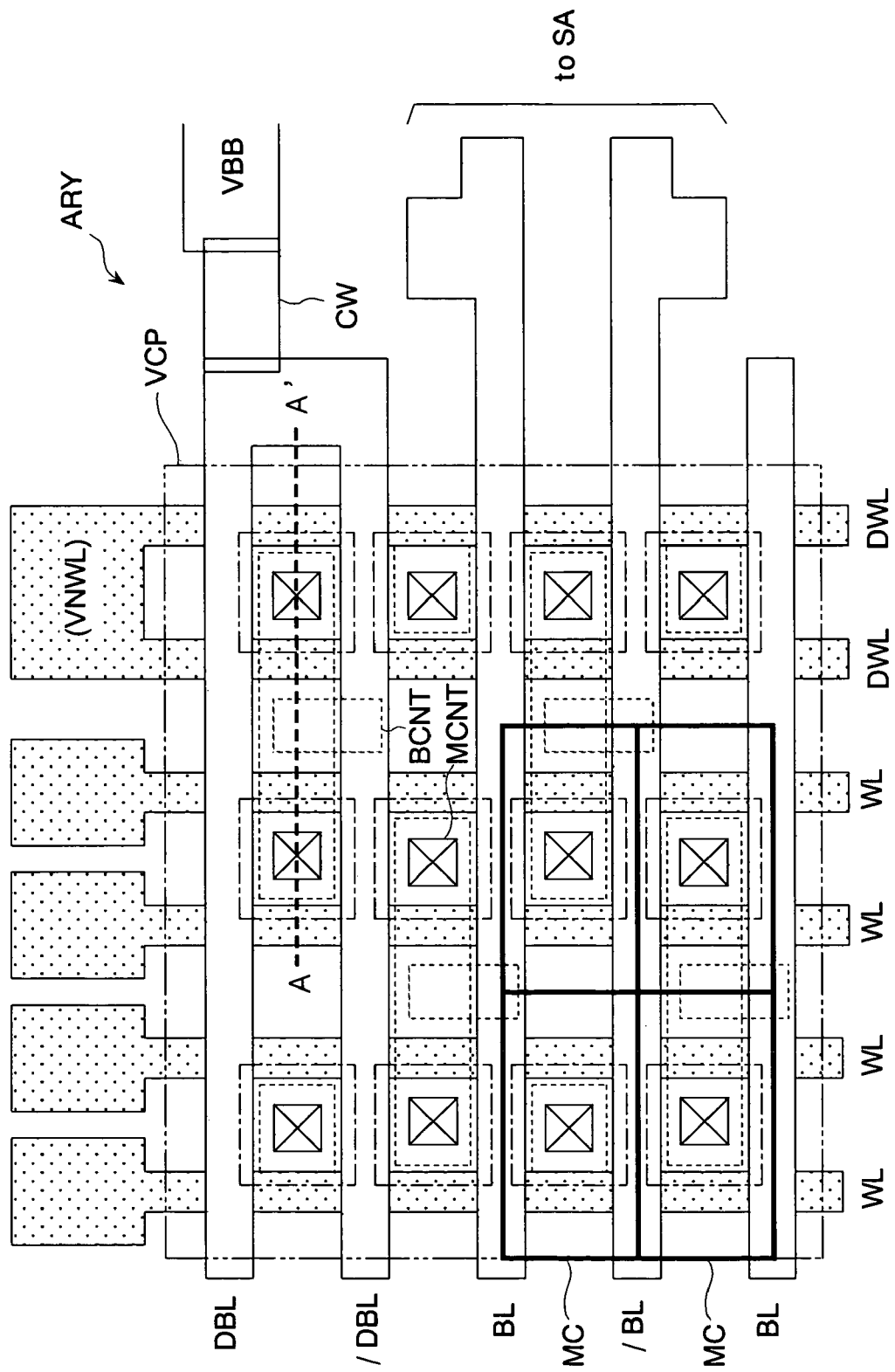
FIG. 3 is a layout view showing the details of a memory cell array shown in FIG. 2.

FIG. 3 shows the layout of the memory cell array ARY shown in FIG. 2. In the drawing, the word lines WL and DWL are indicated by half-tone dot meshed areas and source/drain regions of the transfer transistors T1 of the memory cells MC and DMC (specifically, regions into which ions are implanted to form the source/drain regions) are indicated by dashed lines.

The connection nodes of the transfer transistors T1 and the capacitors C1 of the memory cells MC and DMC, that is, contacts of diffusion regions of the memory cells MC and DMC (memory cell contacts MCNT), are indicated by rectangular shapes to which symbols X are appended. Further, the shapes of the capacitors C1 (cylinder parts CYL shown in FIG. 4 described below) of the memory cells MC and DMC are indicated by one-dot-chain lines. A cell plate voltage line VCP, which is a common electrode of the capacitors C1, is indicated by a two-dot-chain line. Rectangular frames indicated by thick lines on a lower left side of the drawing represent the memory cells MC, respectively. Rectangular frames in broken lines which overlap the bit lines BL, /BL, and /DBL represent bit line contacts BCNT for connecting the bit lines BL, /BL, and /DBL to one of the source/drain regions of the transfer transistors T1. In the present embodiment, the dummy bit lines DBL and /DBL are directly connected to a substrate voltage line VBB (negative voltage line) via a connection wiring line CW, without passing through the elements, such as the transistors, or the like.

In the FCRAM of the present embodiment, from the shape and the structure of the bit line contact BCNT and characteristics of a semiconductor production equipment for fabricating the FCRAM, it can be seen that a positioning margin of the bit line contact BCNT to an n-type diffusion region is small in the circumferential portion of the memory cell array ARY. If the formation position of the bit line contact BCNT deviates from the center of the n-type diffusion region N+, the bit line contact BCNT may be connected to a p-type well region PWELL (−0.4 V, a circuit element to which the negative voltage is supplied) to be electrically short-circuited. When the dummy bit line /DBL is connected to the precharge voltage line VPR (0.8 V), like the related art, a leak current flows from the precharge voltage line VPR to the substrate voltage line VBB due to the occurrence of the electrical short-circuit. As a result, the VPR generator 12 and the VBB generator 18 shown in FIG. 1 constantly operate to generate the voltages VPR and VBB even in the standby period of the FCRAM, thereby increasing the standby current.

On the other hand, in the present embodiment, the dummy bit line /DBL is directly connected to the substrate voltage line VBB. For this reason, even when the bit line contact BCNT of the dummy bit line /DBL is connected to the p-type well region PWELL (−0.4 V) to be electrically short-circuited, the leak current does not occur. The VPR generator 12 and the VBB generator 18 do not perform useless operations, thereby preventing the standby current from increasing. Thus, in particular, in the FCRAM having the rigid specification of the standby current, the yield can be prevented from lowering due to the standby current failure caused by the contact failure of the dummy bit line /DBL.

Figure 4:
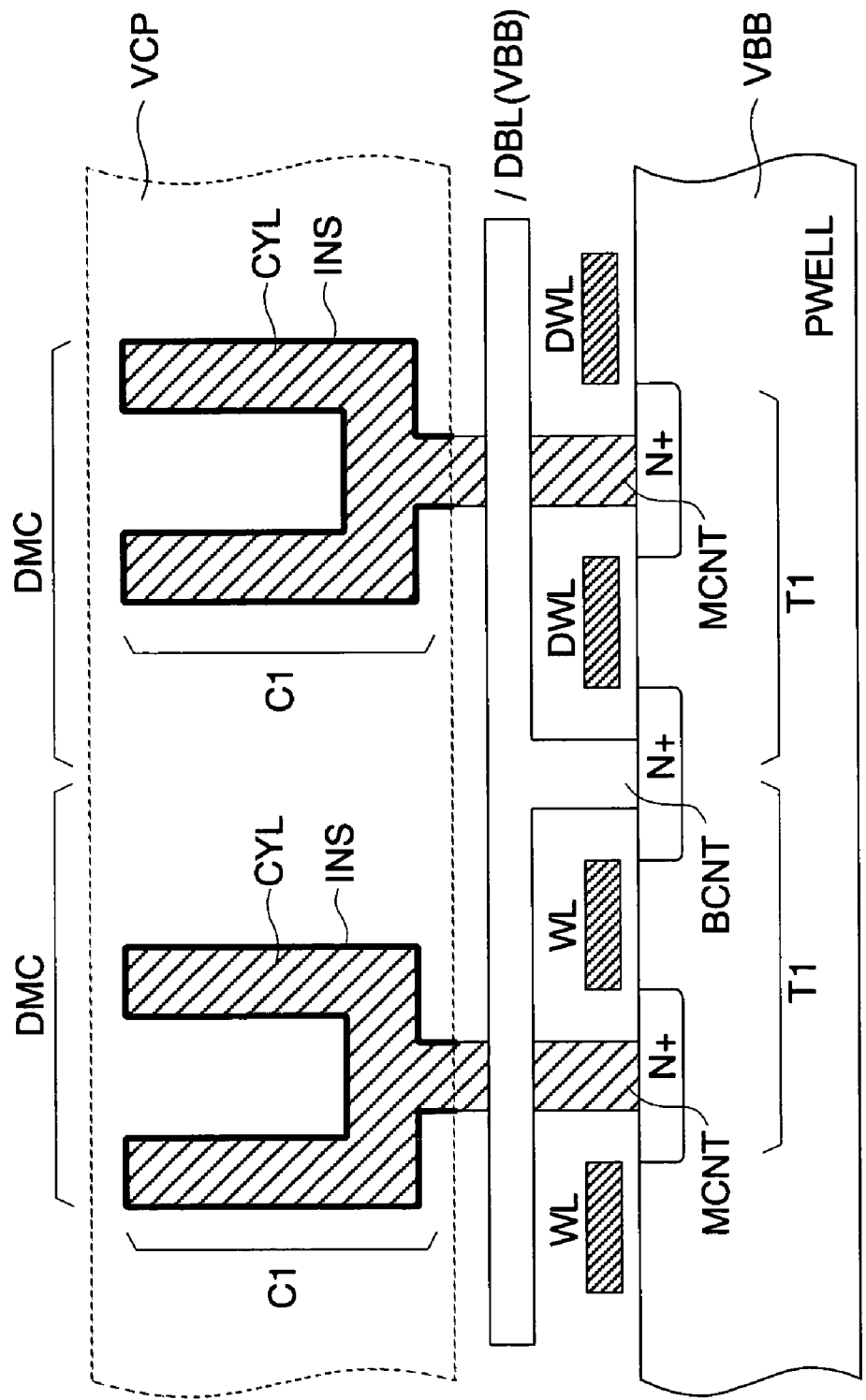
FIG. 4 is a cross-sectional view taken along the line A-A' of FIG. 3.

FIG. 4 shows a section taken along the line A-A' of FIG. 3. In FIG. 4, the section of the dummy memory cell DMC is shown, but the section of the memory cell MC is the same. The n-type diffusion region N+, which is the source/drain region of the transfer transistor T1 (dummy transistor) of the dummy memory cell DMC is formed on the surface of the p-type well region PWELL which corresponds to the substrate of the memory cell array ARY. The n-type diffusion region N+ is formed by implanting an impurity, such as phosphor (P), arsenic (As), or the like, in a self-alignment manner with the word lines WL and DWL as a photo mask and by thermally diffusing the impurity. The dummy bit line /DBL is connected to the n-type diffusion region N+ via the bit line contact BCNT. Moreover, the p-type well region PWELL may be a p-type semiconductor substrate itself or may be formed by implanting an impurity on a p-type or n-type semiconductor substrate.

The word lines WL and DWL formed on the p-type well region PWELL via an insulator film constitute the gates of the transfer transistors T1. The capacitor C1 (the cylinder part CYL) of each of the dummy memory cells DMC is connected to the n-type diffusion region N+ via the memory cell contact MCNT. Between the cylinder part CYL and the cell plate voltage line VCP, an insulator film INS, which is indicated by a thick line in the drawing, is formed.

As described above, in the first embodiment, when it is judged that the bit line contact BCNT of the dummy bit line /DBL is liable to be connected to the p-type well region PWELL to be electrically short-circuited, the dummy bit line is directly connected to the substrate voltage line VBB to which the substrate voltage VBB of the memory cell MC is supplied. For this reason, even when the bit line contact BCNT is connected to the p-type well region PWELL to be electrically short-circuited, the standby current can be prevented from increasing due to the electrical short-circuit. As a result, the yield of the FCRAM can be enhanced. The dummy bit line /DBL is constantly connected to the substrate voltage line VBB, without in the floating state. For this reason, the malfunction due to the crosstalk does not occur. In the memory cell array ARY, the dummy memory cell DMC, the dummy bit line DBL and /DBL, and the dummy word line DWL have the same shapes as those in the related art, and thus the effect on the halation is maintained.

Figure 5:
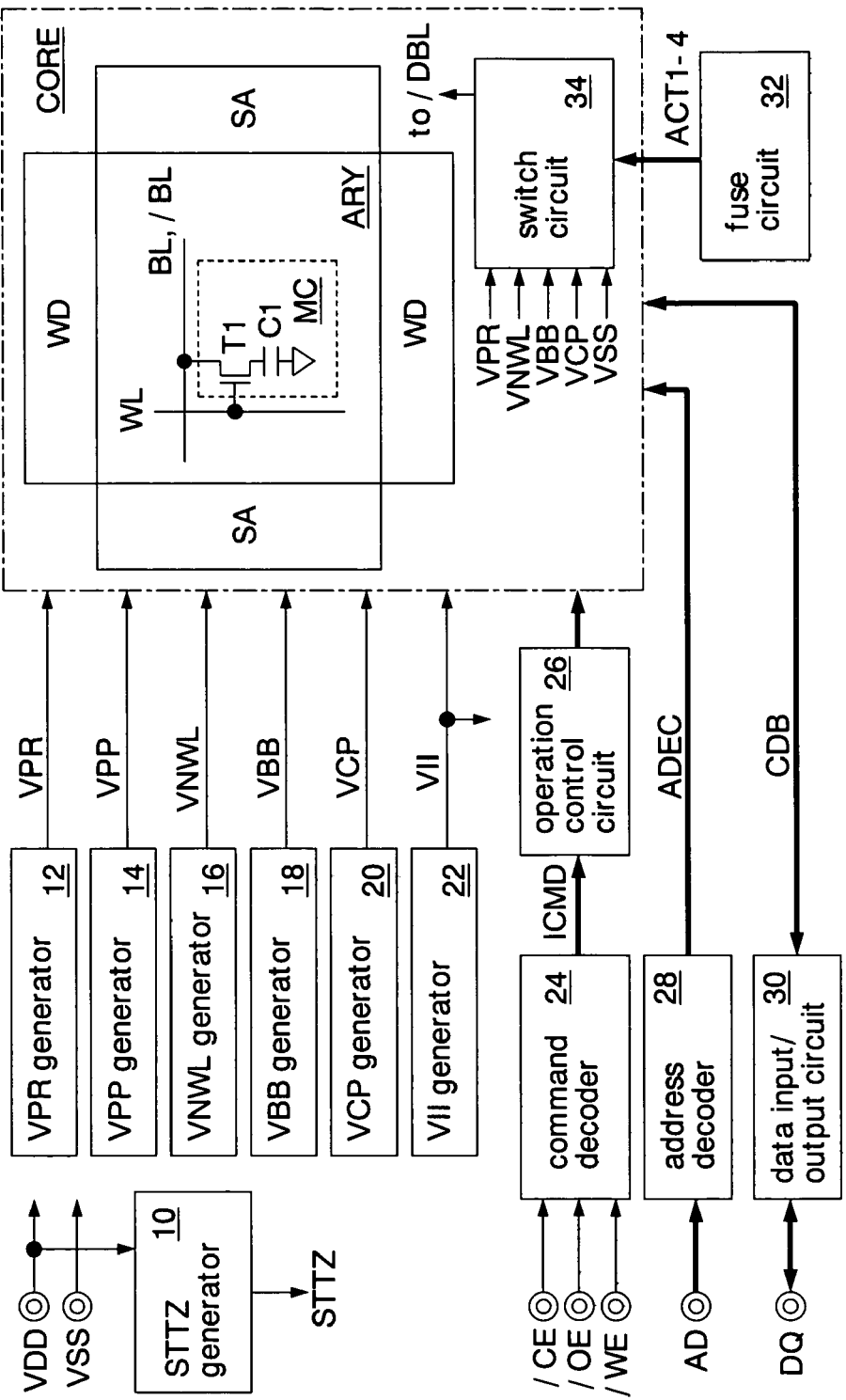
FIG. 5 is a block diagram showing a semiconductor memory according to a second embodiment of the invention.

FIG. 5 shows a semiconductor memory according to a second embodiment of the invention. The same parts as those described in the first embodiment are represented by the same reference numerals and the detail descriptions thereof will be omitted. In the present embodiment, in the FCRAM in the first embodiment, a fuse circuit 32 (programming circuit) and a switch circuit 34 are newly formed. Other configurations are the same as those in the first embodiment. Moreover, though not shown, the FCRAM has a redundant memory cell row that relieves bad memory cells MC and word lines WL, a redundant memory cell column that relieves bad memory cells MC and bit lines BL and /BL, and a redundant fuse circuit in which an address indicating the relieved memory cell MC is programmed.

The fuse circuit 32 sets any one of activation signals ACT1 to ACT4 according to a built-in fuse to a high level or sets all activation signals ACT1 to ACT4 to low levels. The switch circuit 34 connects any one of the internal voltage lines VPR, VNWL, VBB, and VCP and a ground line VSS to the dummy bit line /DBL according to the activation signals ACT1 to ACT4. The fuse circuit 32 and the switch circuit 34 function as a connection setting circuit that connects the dummy bit line /DBL to any one of the plurality of internal voltage lines VPR, VNWL, VBB, VCP, and VSS to which the internal voltages are supplied, respectively.

Figure 6:
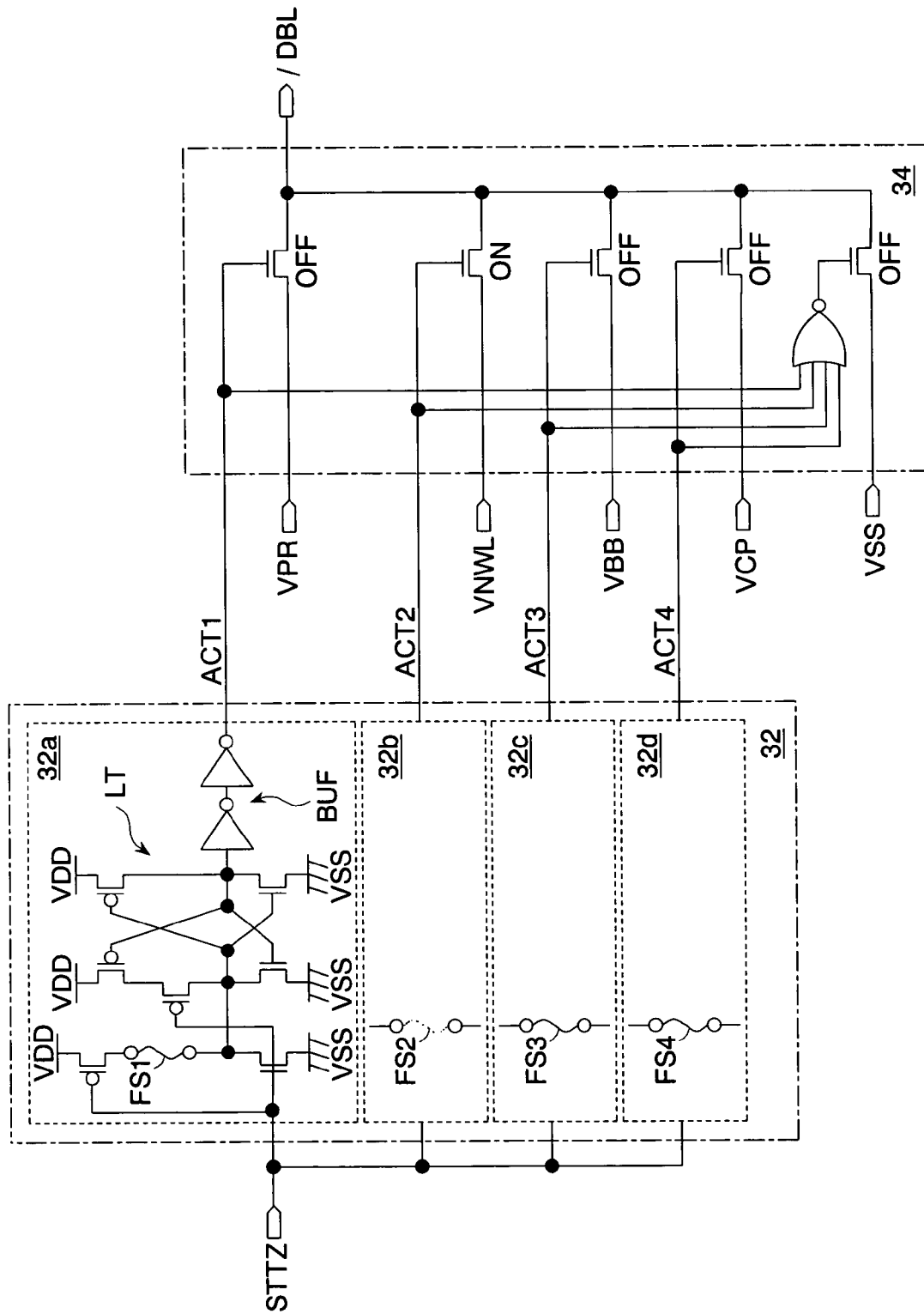
FIG. 6 is a circuit diagram showing the details of a fuse circuit and a switch circuit shown in FIG. 5.

FIG. 6 shows the details of the fuse circuit 32 and the switch circuit 34 shown in FIG. 5. The fuse circuit 32 has sub-fuse circuits 32a, 32b, 32c, and 32d that generate the activation signals ACT (ACT1 to ACT4). Each of the sub-fuse circuits 32a, 32b, 32c, and 32d has a fuse FS (FS1, FS2, FS3, and FS4), a latch LT, and a buffer BUF (two inverters). Each of the sub-fuse circuits 32a, 32b, 32c, and 32d is initialized by the starter signal STTZ and outputs a signal at a logical level according to the programmed state of the fuse FS (FS1 to FS4). Each activation signal ACT changes into a high level when the fuse FS is programmed (blow state). Each activation signal ACT changes into a low level when the fuse FS is not programmed (unblown state). In the present embodiment, the fuses FS1 to FS4 of the fuse circuit 32 are blown, if necessary in a fuse process (the fabricating process of the FCRAM) for relieving the failure. For this reason, with resetting of the power-on of the FCRAM, the activation signals ACT1 to ACT4 are outputted.

The switch circuit 34 has five nMOS transistors that connect the internal voltage lines VPR, VNWL, VBB, and VCP and the ground line VSS to the dummy bit line /DBL and a four-input NOR circuit. The four-input NOR circuit receives the activation signals ACT1 to ACT4 as inputs. Gates of the nMOS transistors receive the activation signals ACT1 to ACT4 and the output of the four-input NOR circuit. For this reason, with resetting of the power-on of the FCRAM, any one of the voltage lines VPR, VNWL, VBB, and VCP and the ground line VSS is connected to the dummy bit line /DBL. In FIG. 6, only the fuse FS2 is blown, only the nMOS transistor corresponding to the resetting voltage line VNWL is turned on, and other nMOS transistors are turned off. Accordingly, the dummy bit line /DBL is fixed to the resetting voltage VNWL. When all fuses FS1 to FS4 are unblown, the four-input NOR circuit outputs the high level, and thus the dummy bit lines DBL and /DBL are connected to the ground line VSS.

Figure 7:
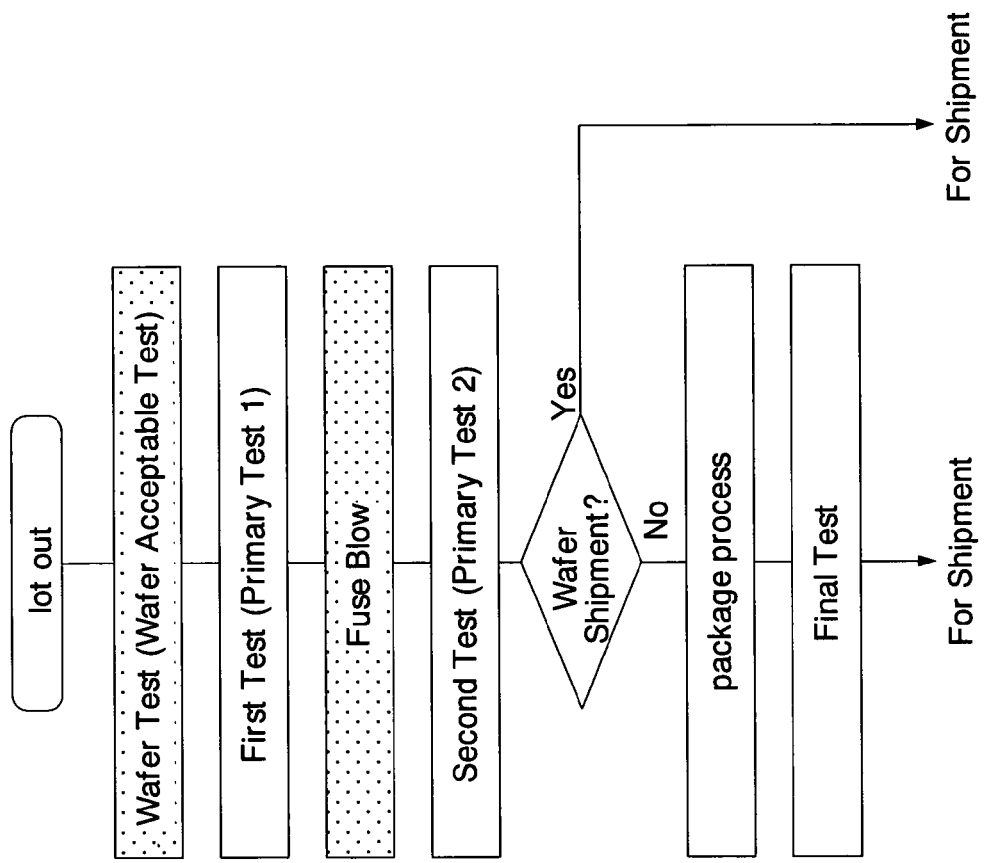
FIG. 7 is a flowchart showing a fabricating process in the second embodiment after a wafer is completed.

FIG. 7 shows a fabricating process in the second embodiment after a wafer is completed. Here, a plurality of FCRAM chips and a TEG (Test Element Group) chip with a part of the memory cell array ARY in the FCRAM or various transistors having different gate sizes formed therein are formed on the wafer. The TEG chip is an evaluation circuit that indirectly evaluates electrical characteristics of the FCRAM chips on the wafer. After the lot out, first, a wafer test (Wafer Acceptable Test) is executed by using the TEG chip. In the wafer test, the basic characteristics of the transistor, such as the threshold voltage, and the like, the failure category generated in the memory cell array, and the like are evaluated. At this time, the cause for the short failure of the bit line BL or /BL is also evaluated.

Next, in a first test process (Primary Test 1), the measurements of AC characteristics and DC characteristics (the operation test of the FCRAM) are executed. Through the first test, the FCRAM having a relievable failure (the FCRAM to be relieved) is detected. Then, through a fuse blow process (Fuse Blow), the redundant fuse circuit of the FCRAM to be relieved is programmed. At this time, according to the cause for the short failure of the bit line BL or /BL, which will be apparent through the wafer test, the fuse circuit 32 shown in FIG. 6 is programmed. Through programming, any one of the voltage lines VPR, VNWL, VBB, VCP, and VSS is connected to the dummy bit line /DBL. Next, through a second test process (Primary Test 2), the measurements of AC characteristics and DC characteristics (the operation test of the FCRAM) are executed. Through the second test process, good chips and bad chips are divided.

When the FCRAMs are shipped while being on the wafer, the wafer is packaged to be shipped. When the packaged FCRAMs are shipped, the wafer is diced and the FCRAM chips are cut out. The FCRAM chips are molded in a package through a package process. Then, through a final test process (Final Test), a final test on failures, including a failure generated in the package process, is executed.

Figure 8:
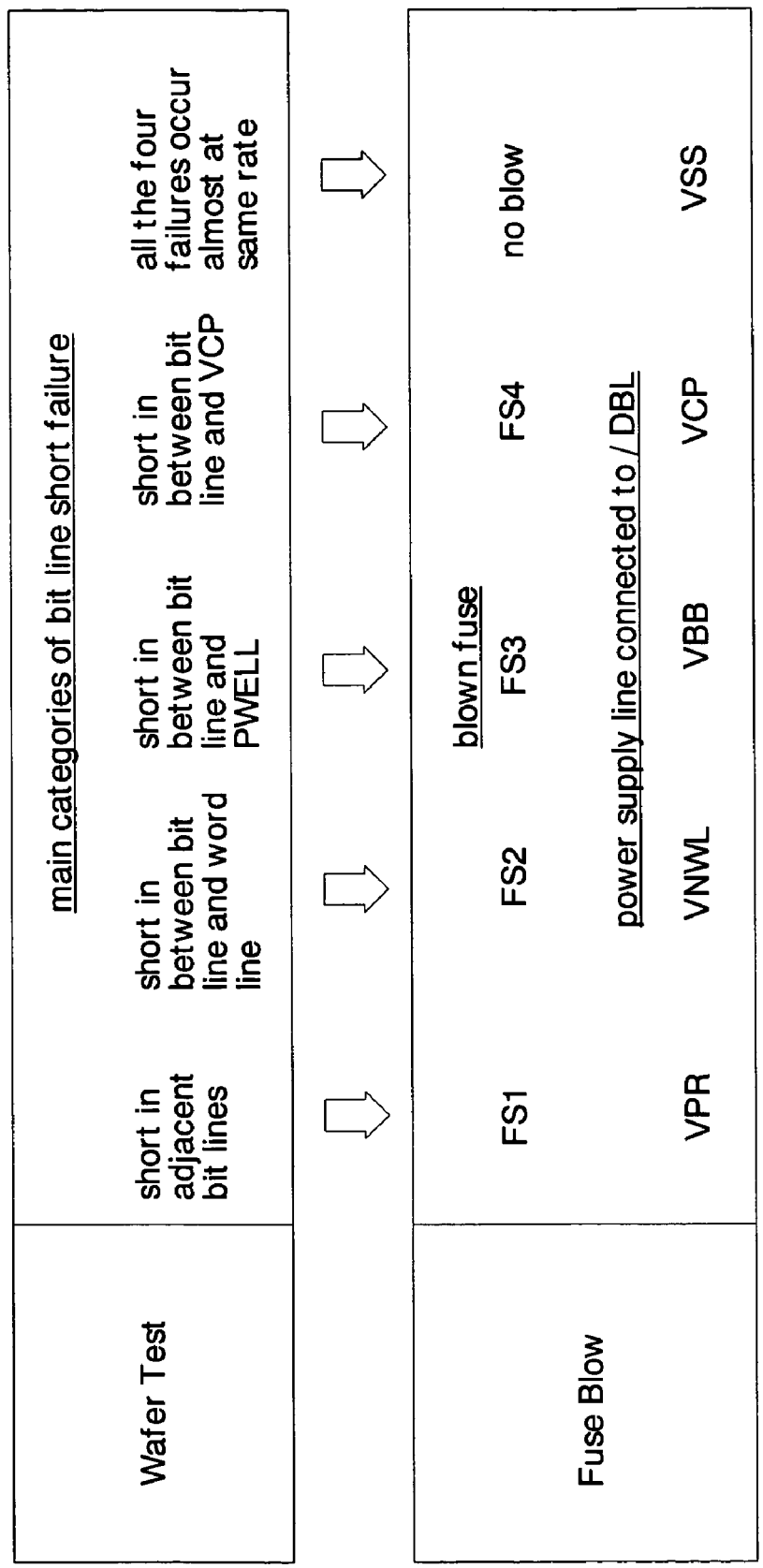
FIG. 8 is a diagram illustrating a process in which a voltage line to be connected to a dummy bit line is determined, in the flow shown in FIG. 7.

FIG. 8 shows a process for determining a voltage line to be connected to the dummy bit line /DBL in the flow shown in FIG. 7. This determination is executed by an LSI tester that executes the wafer test. Determined information is transmitted to a fuse blow equipment, together with a wafer number or a chip number.

When a main cause (category) for the short failure of the bit line is an electrical short-circuit between adjacent bit lines BL and /BL (pair bit line failure), adjacent dummy bit line /DBL and bit line BL are liable to be connected to be electrically short-circuited. At this time, in the fuse blow process, the fuse FS1 is blown. The dummy bit line /DBL is fixed to the precharge voltage VPR (internal voltage) after the power-on of the FCRAM. Accordingly, even when the dummy bit line /DBL and the bit line BL are connected to be electrically short-circuited, the leak current doe not occur and the VPR generator 12 (internal voltage generator) is prevented from uselessly operating. As a result, the yield can be prevented from lowering due to the standby current failure caused by the dummy bit line /DBL.

Similarly, the main cause of the short failure of the bit line is an electrical short-circuit between the bit line BL or /BL and the word line WL (a bit line failure and a word line failure occur), adjacent dummy bit line /DBL and word line WL are liable to be connected to be electrically short-circuited. This electrical short-circuit occurs, for example, between the bit line contact BCNT of the dummy bit line /DBL and the word line WL as shown in FIG. 4. At this time, in the fuse blow process, the fuse FS2 is blown. The dummy bit line /DBL is fixed to the resetting voltage VNWL (internal voltage) after the power-on of the FCRAM. Accordingly, in the standby period in which the word line WL is held in a non-selection state (VNWL), the VNWL generator 16 (internal voltage generator) can be prevented from uselessly operating. As a result, the yield can be prevented from lowering due to the standby current failure caused by the dummy bit line /DBL.

Like the first embodiment, when the main cause for the short failure of the bit line is the electrical short-circuit between the bit line BL or /BL and the p-type well region PWELL (the bit line failure and the refresh failure occur), the dummy bit line /DBL and the p-type well region PWELL are liable to be connected to be electrically short-circuited. At this time, in the fuse blow process, the fuse FS3 is blown. The dummy bit line /DBL is fixed to the substrate voltage VBB (internal voltage) after the power-on of the FCRAM. Accordingly, in the standby period, the VBB generator 18 (internal voltage generator) can be prevented from uselessly operating. As a result, the yield can be prevented from lowering due to the standby current failure caused by the dummy bit line /DBL.

When the main cause for the short failure of the bit line is the electrical short-circuit between the bit line BL or /BL and the cell plate voltage line VCP (single bit-line failure), the dummy bit line /DBL and the cell plate voltage line VCP are liable to be connected to be electrically short-circuited. This electrical short-circuit occurs, for example, between a wiring layer of the dummy bit line /DBL and a wiring layer of the cell plate voltage line VCP shown in FIG. 4. At this time, in the fuse blow process, the fuse FS4 is blown. The dummy bit line /DBL is fixed to the cell plate voltage VCP (internal voltage) after the power-on of the FCRAM. Accordingly, in the standby period, the VCP generator 20 (internal voltage generator) can be prevented from uselessly operating. As a result, the yield can be prevented from lowering due to the standby current failure caused by the dummy bit line /DBL.

In addition, when multiple causes for the short failure of the bit line exist and any failure category occurs at the same ratio, in the fuse blow process, the fuses FS1 to FS4 are not cut. The dummy bit line /DBL is fixed to the ground voltage VSS after the power-on of the FCRAM. When the occurrence ratios of the failure categories are substantially the same, the dummy bit line /DBL is fixed to the ground voltage VSS, which is an intermediate value between the positive voltages VPR and VCP and the negative voltages VNWL and VBB. Thus, even when any one of the above-described failures occurs in the dummy bit line /DBL, the voltage difference can be small and the leak amount can be minimized. Therefore, the useless operations of the generators 12, 16, 18, and 20 shown in FIG. 5 can be minimized and the standby failure ratio can be reduced.

As described above, even in the second embodiment, the same advantages as those in the above-described first embodiment can be obtained. Further, in the present embodiment, through programming of the fuse circuit 32, the dummy bit line /DBL can be connected to any one of the voltage lines VPR, VNWL, VBB, VCP, and VSS. For this reason, even when the fabricating condition of the FCRAM changes and the main failure category regarding the standby current failure changes, the fuse circuit 32 is programmed according to a new failure category, such that the standby current can be prevented from increasing and thus the yield of the FCRAM can be enhanced.

Since the fuse circuit 32 is formed, in the fabricating process of the FCRAM, information indicating the voltage lines VPR, VNWL, VBB, VCP, and VSS can be easily programmed by using the existing equipment. For this reason, according to the present embodiment, the increase in cost of the FCRAM can be prevented.

When a plurality of circuit elements which are liable to be connected to the dummy bit line /DBL to be electrically short-circuited exist and the voltages constantly supplied to these circuit elements are the positive voltage and the negative voltage, if a plurality of failure categories regarding the standby current failure are substantially equal to one another, the dummy bit line /DBL is connected to the ground line VSS. When the dummy bit line /DBL and any of the circuit elements are connected to be electrically short-circuited, the difference between the voltage supplied to that circuit element and the ground voltage can be averagely small in multiple FCRAMs. Therefore, according to the present embodiment of the invention, the distribution of the standby current value of the FCRAM can be shifted to the lower side. As a result, the yield of FCRAM can be enhanced.

The fuse circuit 32 is programmed according to the evaluation result in the wafer test and thus, according to the electrical characteristics of the FCRAM, the dummy bit line /DBL can be connected to a desired voltage line for each wafer, on which the FCRAM is formed. As a result, the yield of the FCRAM can be enhanced.

Figure 9:
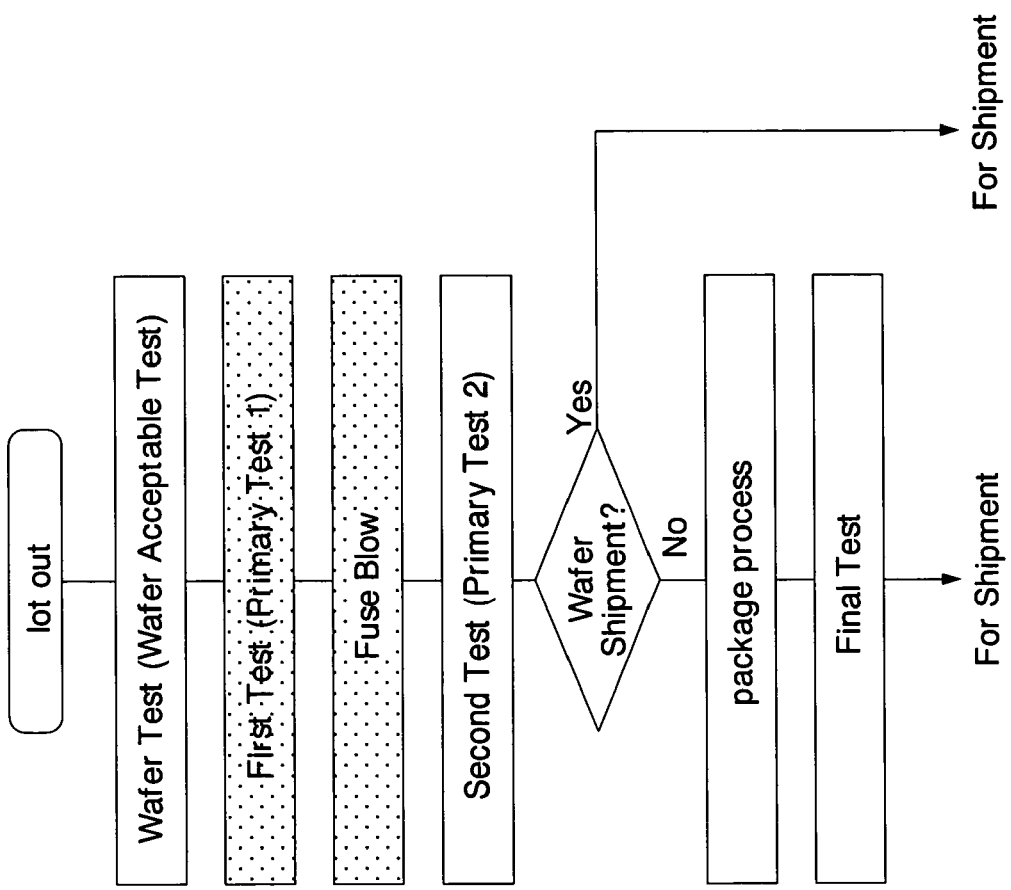
FIG. 9 is a flowchart showing a fabrication process in a semiconductor memory according to a third embodiment after a wafer is completed.

FIG. 9 shows a fabricating process, after the wafer is completed, in a semiconductor memory of a third embodiment of the invention. The same parts as those described in the first and second embodiment are represented by the same reference numerals and the detail descriptions thereof will be omitted. The semiconductor memory of the present embodiment is the same as the FCRAM (FIG. 5) of the second embodiment. The fabricating processes are the same as those in FIG. 7, except for the wafer test and the first test.

In the present embodiment, in the wafer test in which the TEG chip is evaluated, the basic characteristics of the transistor, such as the threshold voltage, and the like, are evaluated. Next, in the first test, the relievable FCRAM is detected, the connections of the dummy bit lines DBL and /DBL in the memory cell array are changed, and the failure category is evaluated. At this time, the cause (failure category) of the short failure of the bit lines BL and /BL is also evaluated from the distribution of the failure categories. Then, like the second embodiment, the redundant fuse circuit of the FCRAM to be relieved is programmed through the fuse blow process. Similarly, according to the evaluation result of the first test, the fuses FS1 to FS4 are blown (FIG. 6) and the dummy bit line /DBL is connected to any one of the internal voltage lines VPR, VNWL, VBB, and VCP and the ground line VSS.

As described above, even in the third embodiment, the same advantages as those in the above-described first embodiment can be obtained. Further, in the present embodiment, by using the effect of the first test in which the relievable FCRAM is detected, the dummy bit line /DBL can be connected to any one of the internal voltage lines VPR, VNWL, VBB, and VCP and the ground line VSS. As a result, the yield of the FCRAM can be enhanced.

Figure 10:
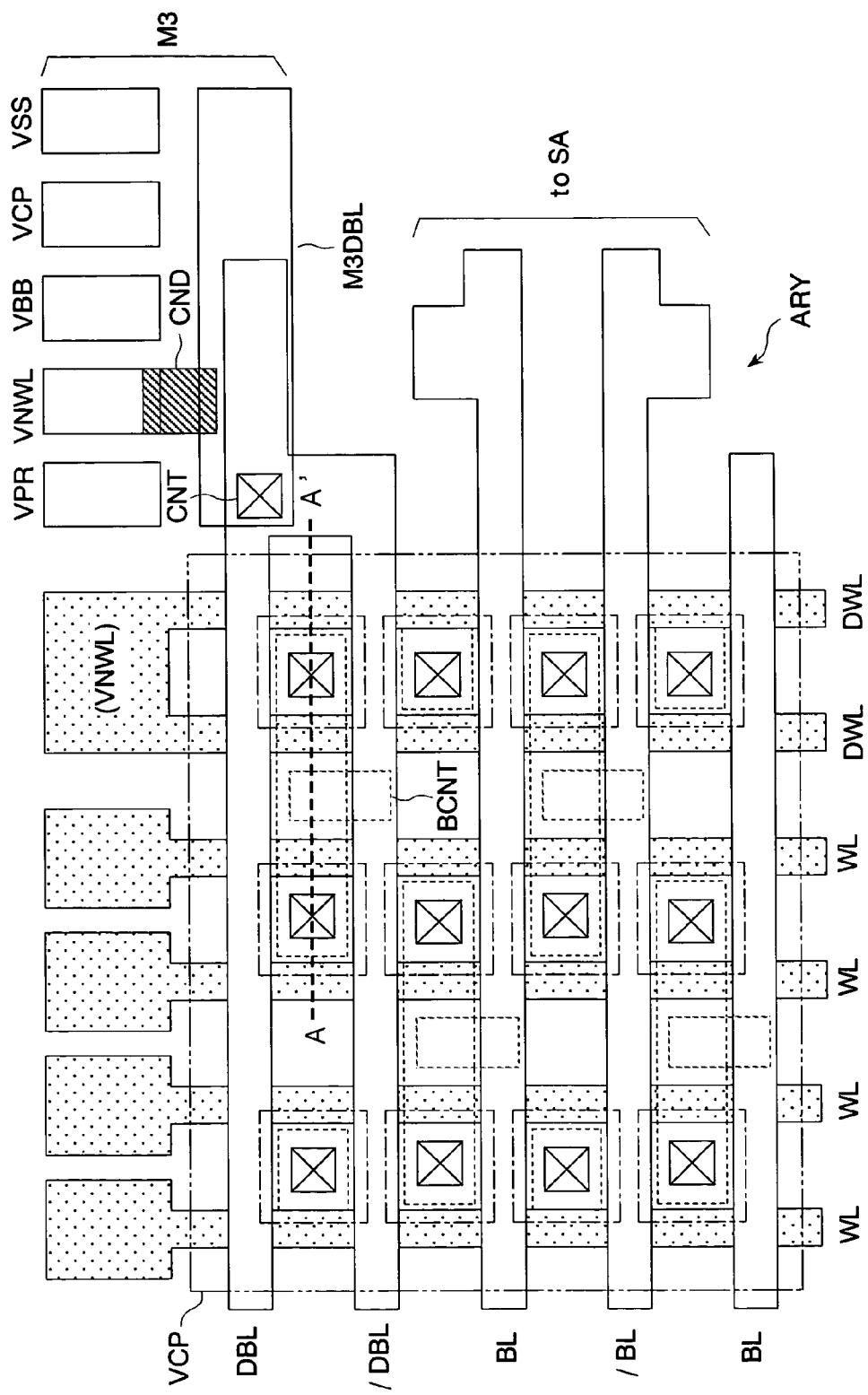
FIG. 10 is a layout view showing the details of a memory cell array in a semiconductor memory according to a fourth embodiment of the invention.

FIG. 10 shows a layout of a memory cell array ARY in a semiconductor memory according to a fourth embodiment of the invention. The same parts as those described in the first and second embodiment are represented by the same reference numerals and the detail descriptions thereof will be omitted. In the present embodiment, at an end of the memory cell array ARY, the wiring lines of the precharge voltage line VPR, the resetting voltage line VNWL, the substrate voltage line VBB, the cell plate voltage line VCP, and the ground line VSS are sequentially arranged in parallel with one another along the dummy bit lines DBL and /DBL. Each of the internal voltage lines VPR, VNWL, VBB, VCP, and VSS are formed with an uppermost metal wiring layer M3 of the FCRAM chip.

The wiring lines of the dummy bit lines DBL and /DBL (which are formed with a secondary wiring layer on PWELL, as shown in FIG. 4) are connected to a wiring line M3DBL via a contact CNT. The wiring line M3DBL is formed with the wiring layer M3. Other configurations of the memory cell array ARY as the same as those of the first embodiment (FIG. 3). The wiring line M3DBL connected to the dummy bit lines DBL and /DBL is connected to any one of the voltage lines VPR, VNWL, VBB, VCP, and VSS (in this example, VNWL) via a conductive film CND. The conductive film CND is formed on the semiconductor substrate to correspond to the pattern shape of the photo mask which is used for the semiconductor fabrication process to fabricate the FCRAM. In this example, the photo mask for forming the conductive film CND is a photo mask corresponding to the metal wiring layer M3. Five types of photo masks may be created according to the formation position of the conductive film CND.

The present embodiment is effective, for example, when the change in the fabricating condition of the FCRAM and the relationship between the bit line BL, /BL, DBL, or /DBL and the circuit element to which the bit line BL, /BL, DBL, or /DBL is liable to be connected to be electrically short-circuited are judged. The circuit element is one of adjacent bit line BL or /BL (VPR), the word line WL (VNWL), the p-type well region PWELL (VBB), and the capacitor C1 (VCP). Then, the dummy bit lines DBL and /DBL is connected to the internal voltage line (any one of VPR, VNWL, VBB, and VCP) corresponding to the internal voltage supplied to the circuit element which is liable to be connected the dummy bit line DBL or /DBL to be electrically short-circuited.

Alternatively, during the mass production of the FCRAMs, according to the change in distribution of the failure categories caused by the change in the fabricating condition, the photo mask may be changed so as to change the position of the conductive film CND to be formed. The photo mask for forming the conductive film CND is used in a final wiring process. For this reason, the photo mask is easily changed according to the change in the fabricating condition. Since the voltage line, to which the dummy bit line DBL and /DBL are connected, can be changed according to the change in the failure category, the standby current can be prevented from increasing due to the change in the failure category and thus the yield can be prevented from lowering.

As described above, even in the fourth embodiment, the same advantages as those in the above-described first embodiment can be obtained. Further, in the present embodiment, the photo mask for forming the conductive film CND is changed according to the change in the fabricating condition, and thus the yield of the FCRAM can be enhanced.

Figure 11:
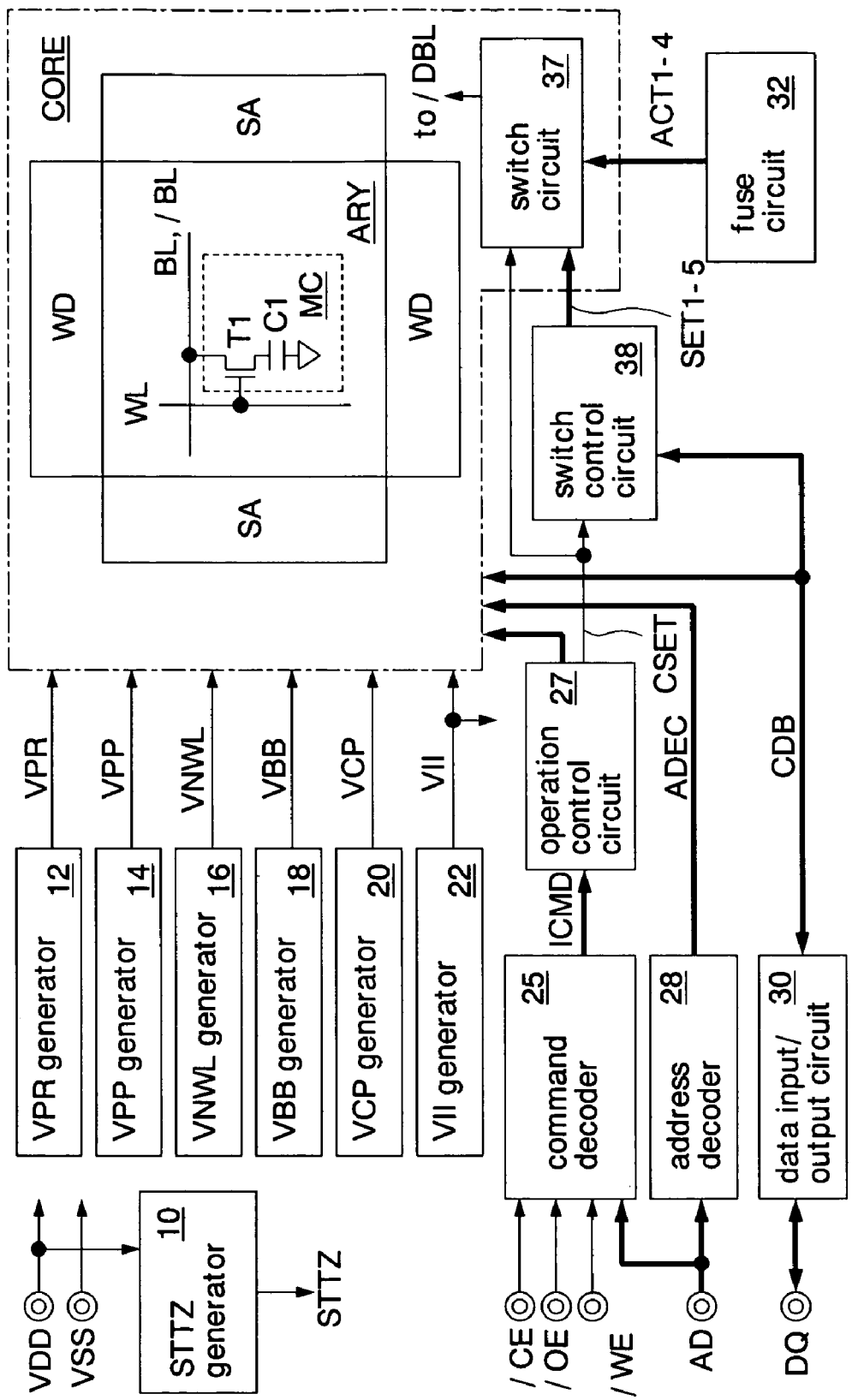
FIG. 11 is a block diagram showing a semiconductor memory according to a fifth embodiment of the invention.

FIG. 11 shows a semiconductor memory according to a fifth embodiment of the invention. The same parts as those described in the first and second embodiment are represented by the same reference numerals and the detail descriptions thereof will be omitted. The FCRAM of the present embodiment has a command decoder 25, an operation control circuit 27, and a switch circuit 37, instead of the command decoder 24, the operation control circuit 26, and the switch circuit 34 of the second embodiment. Further, the FCRAM additionally has a switch control circuit 38. Other configurations are substantially the same as those of the second embodiment (FIG. 5).

The command decoder 25 has a function that, when it is judged that external command signals supplied to the external terminals /CE, /OE, and /WE and an external address signal supplied to the address terminal AD is a connection setting command described below, outputs an internal command signal ICMD (connection setting command) indicating a connection setting command, in addition to the function of the command decoder 24. The operation control circuit 27 has a function that, when receiving the connection setting command, sets a connection setting signal CSET from a low level to a high level and holds the high level, in addition to the function of the operation control circuit 26. The operation control circuit 27 has a function that, in response to the high level of the starter signal STTZ, resets the connection setting signal CSET to the low level. For this reason, the connection setting signal CSET set once is not reset till the next power-on.

Figure 13:
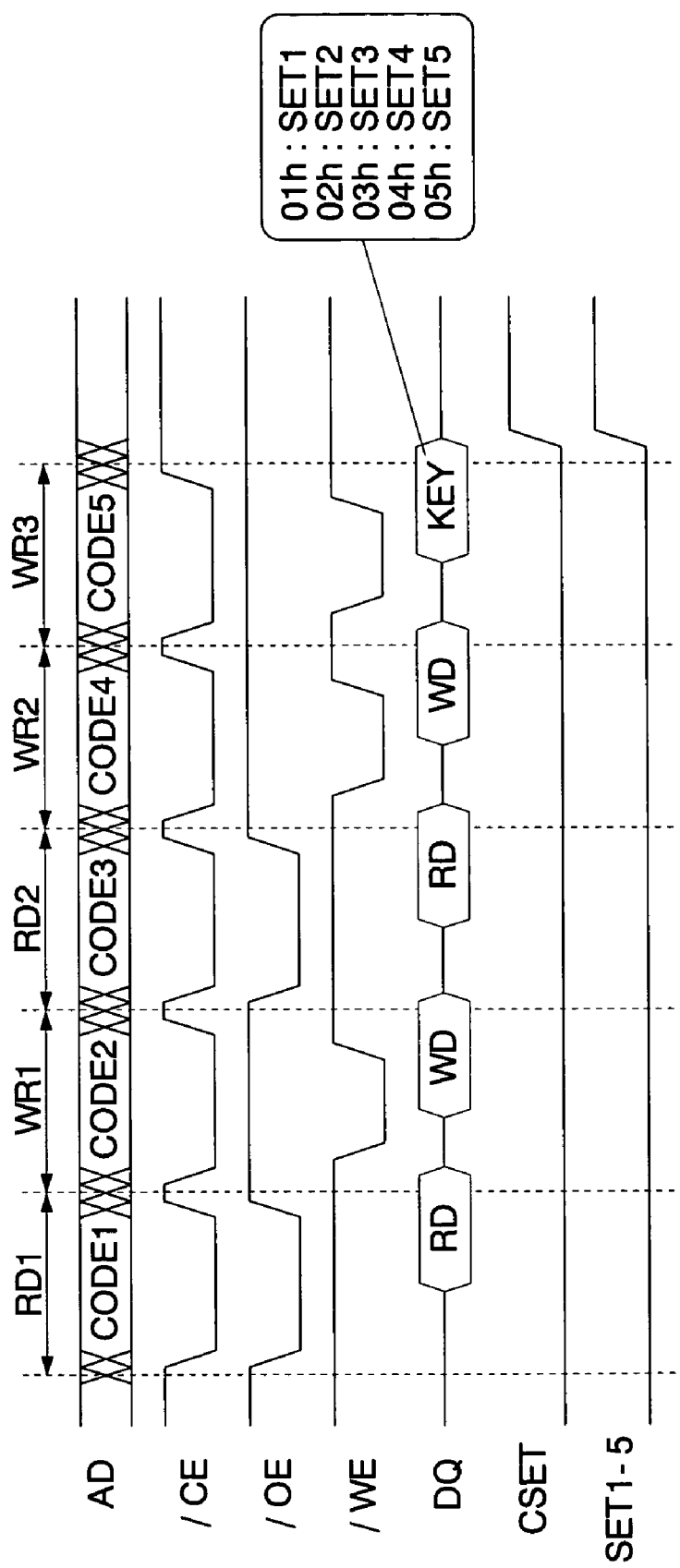
FIG. 13 is a timing chart showing a setting method of a switch circuit in the fifth embodiment.

When the connection setting signal CSET is the high level, the switch control circuit 38 sets any one of setting signals SET1 to SET5 to the high level and holds the remaining setting signals SET at the low level according to the value of data supplied to lower 3 bits of the external data terminal DQ. The relationship between the data value and the setting signals SET1 to SET5 is shown in FIG. 13 described below. The switch control circuit 38 has a latch (not shown) that holds the output levels of the setting signals SET1 to SET5. For this reason, the setting signals SET1 to SET5 are held at the same value until they are reset through the next power-on.

When all setting signals SET1 to SET5 are the low levels, the switch circuit 37 connects any one of the voltage lines VPR, VNWL, VBB, VCP, and VSS to the dummy bit line /DBL according to the activation signals ACT1 to ACT4 from the fuse circuit 32. When any one of the setting signals SET1 to SET5 is the high level, that is, when the connection setting command is supplied, the switch circuit 37 connects any of the voltage lines VPR, VNWL, VBB, VCP, and VSS to the dummy bit line /DBL according to the connection specification indicated by the connection setting command, regardless of the programmed state of the fuse circuit 32.

Figure 12:
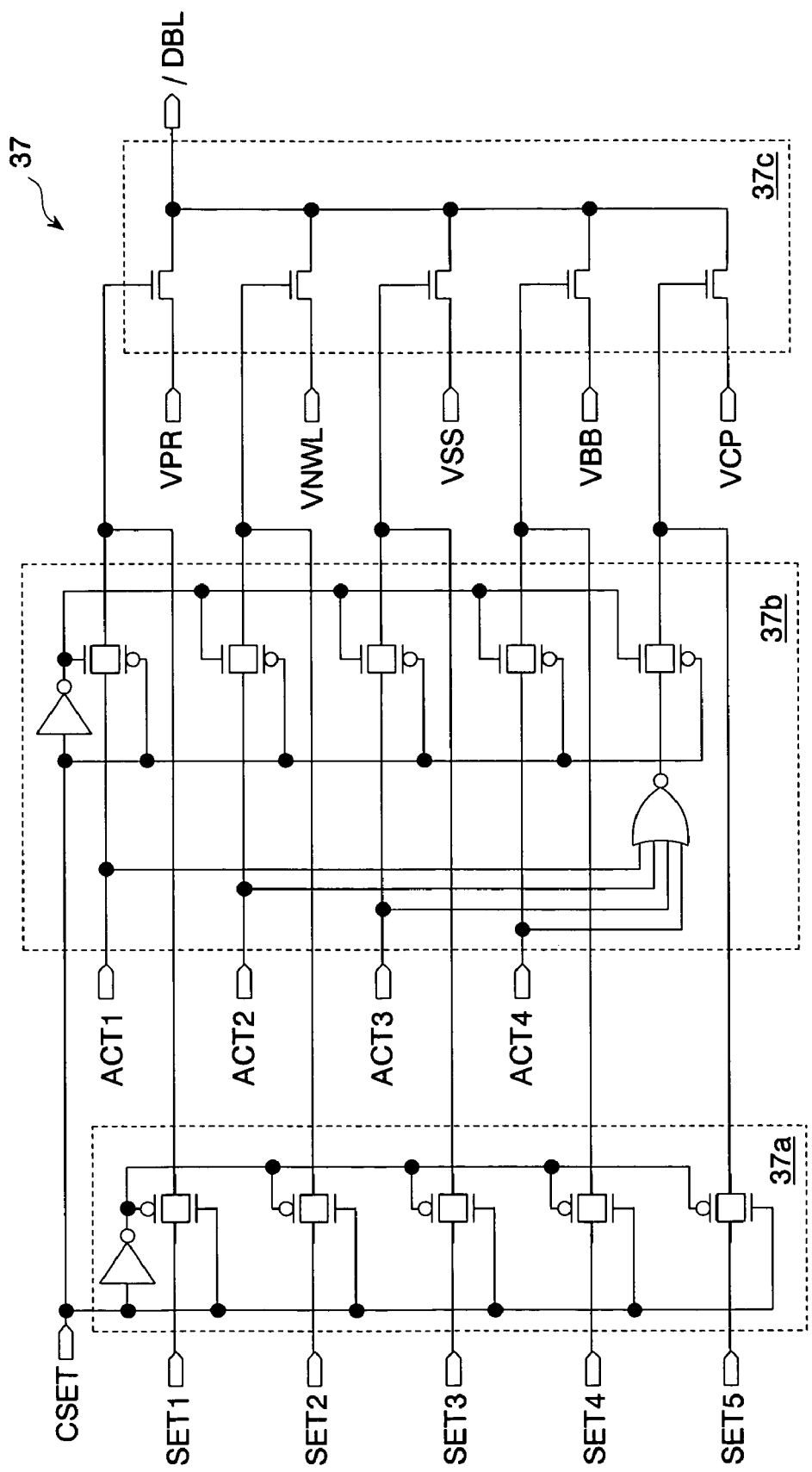
FIG. 12 is a circuit diagram showing the details of a switch circuit shown in FIG. 11.

FIG. 12 shows the details of the switch circuit 37 shown in FIG. 11. The switch circuit 37 has first, second, and third switch circuits 37a, 37b, and 37c. The third switch circuit 37c has nMOS transistors that connect the voltage lines VPR, VNWL, VBB, VCP, and VSS to the dummy bit line /DBL. When the connection setting signal CSET is the high level, the first switch circuit 37a outputs the levels of the setting signals SET1 to SET5 to the third switch circuit 37c. When the connection setting signal CSET is the low level, the output of the first switch circuit 37a is in a floating state.

When the connection setting signal CSET is the low level, the second switch circuit 37b outputs the levels of the activation signals ACT1 to ACT4 and the NOR logic of the activation signals ACT1 to ACT4 to the third switch circuit 37c. When the connection setting signal CSET is the high level, the output of the second switch circuit 37b is in the floating state. For this reason, when the connection setting signal CSET is the low level, like the first embodiment, the dummy bit line /DBL is connected to any one of the voltage lines VPR, VNWL, VBB, VCP, and VSS. When the connection setting signal is the high level, the dummy bit line /DBL is connected to any one of the voltage lines VPR, VNWL, VBB, VCP, and VSS according to the setting signals SET1 to SET5, regardless of the levels of the activation signals ACT1 to ACT4.

FIG. 13 shows the setting method of the switch circuit 37 in a fifth embodiment. In the present embodiment, when a read command RD1, a write command WR1, a read command RD2, and write command WR2 and WR3 are consecutively supplied, the programmed information of the fuse circuit 32 becomes invalid. Here, in order to recognize the connection setting command, the command decoder 25 needs to receive predetermined values CODE1 to CODE5 as the address signal AD, together with the commands RD1, WR1, RD2, WR2, and WR3. The dummy bit line /DBL is connected to any one of the voltage lines VPR, VNWL, VBB, VCP, and VSS according to the value of the data signal DQ supplied together with the connection setting command. That is, when receiving a predetermined combination of multiple types of the operation commands open to the user of the FCRAM, the command decoder 25 recognizes the connection setting command.

Write data DQ supplied together with the write commands WR1 to WR2 has an arbitrary value. When the lower 3 bits (KEY) of write data DQ supplied together with the write command WR3 is 01h to 05h in the hexadecimal notation, the switch control circuit 38 sets the corresponding setting signal SET to the high level. When any one of the above-described conditions is not satisfied, the connection setting command is not recognized. Through the recognition of the connection setting command, the connection setting signal CSET changes to the high level and any one of the setting signals SET1 to SET5 changed to the high level.

As described above, even in the fifth embodiment, the same advantages as those in the above-described second or third embodiment can be obtained. Further, in the present embodiment, the programmed state of the fuse circuit 32 can be invalid according to the connection setting command and the dummy bit line /DBL can be connected to any one of the voltage lines VPR, VNWL, VBB, VCP, and VSS. For example, if the connection setting command is supplied before programming of the fuse circuit 32 and the voltage value of the dummy bit line /DBL is set to various values, the change in the standby current of the FCRAM can be evaluated for each chip. Further, if the connection setting command is supplied after programming of the fuse circuit 32 and the voltage value of the dummy bit line /DBL is set to various values, the cause for the failure of the FCRAM in which the standby current failure is detected after manufacturing can be evaluated in detail.

The connection setting command is recognized by the combination of the operation commands open to the user. For this reason, the user who designs a system on which the FCRAM is mounted, as well as the manufacturer of the semiconductor, can pursue the cause of the standby current failure. In particular, it is effective when a FCRAM for the user only is developed or when the manufacturer of the semiconductor and the user develops a system commonly. Further, since the connection setting command is supplied by using the existing command terminals /CE, /OE, and /WE, the address terminal AD, and the data terminal DQ, a terminal for exclusive use cannot be required. As a result, the chip size of the FCRAM can be prevented from increasing. Further, the FCRAM can be evaluated in the packaged state. Further, the voltage line to be connected to the dummy bit line /DBL is selected according to the value supplied to the data terminal DQ and thus multiple types of the internal voltages can be easily set by the small number of bits.

Figure 14:
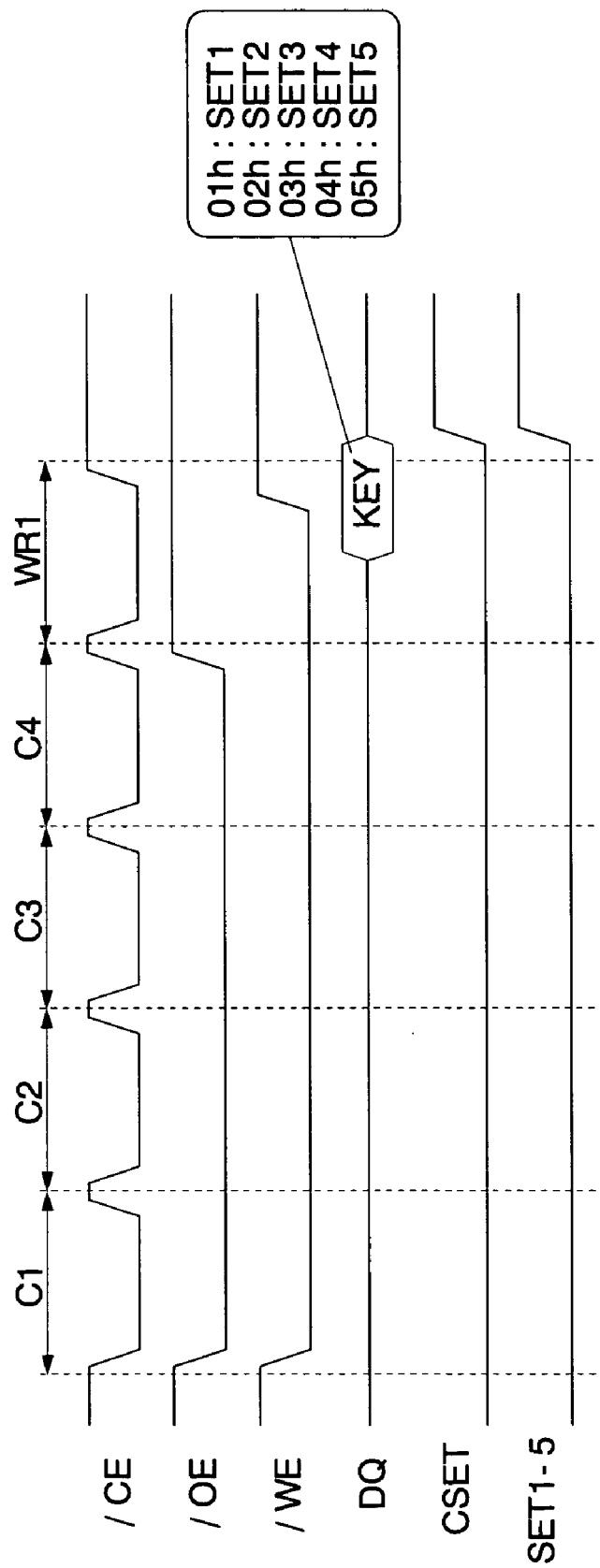
FIG. 14 is a timing chart showing a setting method of a switch circuit in a semiconductor memory according to sixth embodiment of the invention.

FIG. 14 shows the setting method of a switch circuit in a semiconductor memory according to a sixth embodiment of the invention. The same parts as those described in the first, the second, and the fifth embodiments are represented by the same reference numerals and the detail descriptions thereof will be omitted. In the present embodiment, by using a connection setting command for exclusive use (test command or prohibition command) which is not open to the user, the fuse circuit 32 becomes invalid and the dummy bit line /DBL is connected to the voltage line according to the connection setting command. For this reason, the FCRAM of the present embodiment is formed by changing the logic of the command decoder 25 in the fifth embodiment. Other configurations are the same as those of the fifth embodiment.

In the present embodiment, when four commands C1 to C4 (prohibition command), which are not open to the user, are consecutively supplied, the connection setting command is recognized. Then, according to the value of the external data signal DQ supplied, together with the write command WR1, next to the command C4, the programmed information of the fuse circuit 32 becomes invalid and the dummy bit line /DBL is connected to any one of the voltage lines VPR, VNWL, VBB, VCP, and VSS.

As described above, even in the sixth embodiment, the same advantages as those of the second, the third and the fifth embodiments can be obtained. Further, in the present embodiment, since the connection setting command is supplied by the user, the voltage line connected to the dummy bit line /DBL can be prevented from being changed by the user.

Moreover, in the above-described embodiments, the example in which the invention is applied to the FCRAM is described. However, the invention is not limited to the embodiments. For example, the invention can be applied to general pseudo SRAMs, SDRAMs, SRAMs, FeRAMs (Ferroelectric RAMs), semiconductor memories, such as fresh memories or the like, system LSIs having memory cores of these memories built-in.

In the above-described first embodiment, the example in which the dummy bit line /DBL is directly connected to the substrate voltage line VBB is described. However, the invention is not limited to the embodiment. For example, when it is judged that the bit line BL, /BL, DBL, or /DBL is liable to be connected to the word line WL to be electrically short-circuited, the dummy bit line /DBL may be connected to the resetting voltage line VNWL that supplies the resetting voltage VNWL to the word line WL. Accordingly, even when the dummy bit line /DBL is actually connected to the word line WL to be electrically short-circuited, the leak can be prevented from occurring between the dummy bit line /DBL and the word line WL. In particular, all word lines WL are held at the resetting voltage VNWL during the standby. As a result, the standby current can be prevented from increasing and thus the yield of the FCRAM can be enhanced.

In the above-described fifth and sixth embodiments, the example in which the voltage line to be connected to the dummy bit line /DBL is selected according to the value supplied to the data terminal DQ is described. However, the invention is not limited to the embodiments. For example, the voltage line to be connected to the dummy bit line /DBL may be selected according to the value supplied to the address terminal AD.

The invention is not limited to the above embodiments and various modifications may be made without departing from the spirit and scope of the invention. Any improvement may be made in part or all of the components.

What is claimed is:

1. A semiconductor memory comprising:
real memory cells that hold write data;
dummy memory cells that do not hold write data;
a dummy bit line that is connected to said dummy memory cells;
a negative voltage generator that generates a negative voltage to be used in internal circuits of said semiconductor memory according to an external supply voltage;
a negative voltage line that is supplied with said negative voltage;
a circuit element that is formed near line and that is supplied with said negative voltage; and
a connection wiring line that directly connects said dummy bit line to said negative voltage line.

2. The semiconductor memory according to claim 1, further comprising dummy transistors that are formed in said dummy memory cells, wherein
said negative voltage generated by said negative voltage generator is a substrate voltage of each of said dummy transistors.

3. The semiconductor memory according to claim 1, further comprising real transistors that are formed in said real memory cells, and a real word line that is connected to said real memory cells, wherein
said negative voltage generated by said negative voltage generator is a resetting voltage that is supplied to said word line to turn off said real transistors.

4. A semiconductor memory comprising:
real memory cells that hold write data;
dummy memory cells that do not hold write data;
a dummy bit line that is connected to said dummy memory cells;
a plurality of internal voltage generators that generate a plurality of types of internal voltages to be used in internal circuits of said semiconductor memory according to an external supply voltage, respectively;
a plurality of internal voltage lines that are supplied with said internal voltages, respectively;
circuit elements that are formed near said dummy bit line and that are supplied with said internal voltages; and
a connection setting circuit that connects said dummy bit line to any one of said internal voltage lines.

5. The semiconductor memory according to claim 4, wherein said connection setting circuit has
a programming circuit in which information indicating an internal voltage line to be connected to said dummy bit line is programmed in advance and
a switch circuit that connects said dummy bit line to any one of said internal voltage lines according to the programmed state of said programming circuit.

6. The semiconductor memory according to claim 5, wherein said programming circuit has a fuse circuit that has a fuse in which said information is programmed according to a blown or a unblown state and that outputs a signal at a predetermined logical level and
said switch circuit is connected to any one of said internal voltage lines according to said logical level.

7. The semiconductor memory according to claim 5, further comprising a command decoder that decodes an external command, wherein when said external command decoded by said command decoder is a connection setting command, said switch circuit connects said dummy bit line to any one of said internal voltage lines according to a connection specification indicated by said connection setting command, regardless of the programmed state of said programming circuit.

8. The semiconductor memory according to claim 7, wherein said command decoder recognizes said connection setting command when receiving a predetermined combination of a plurality of types of commands open to a user of said semiconductor memory.

9. The semiconductor memory according to claim 7, wherein said command decoder recognizes said connection setting command when receiving a test command which is not open to a user.

10. The semiconductor memory according to claim 7, wherein said switch circuit receives the value of at least one of an external address signal and an external data signal as said connection specification, the external address signal and the external data signal being supplied together with said connection setting command.

11. The semiconductor memory according to claim 4, wherein at least one of said internal voltages is negative voltage and said connection setting circuit connects said dummy bit line to any one of said internal voltage lines or a ground line.

12. The semiconductor memory according to claim 4, wherein said connection setting circuit is formed with a conductive film that is formed on a semiconductor substrate to correspond to said a pattern shape of a photo mask used in a semiconductor fabrication process and that connects any one of said internal voltage lines to said dummy bit line.

13. A method of fabricating a semiconductor memory that has real memory cells that hold write data, dummy memory cells that do not hold write data, and a dummy bit line that is connected to said dummy memory cells and connected to any one of internal voltage lines via a switch circuit which operates according to the programmed state of a programming circuit, the method comprising the steps of:

a wafer test process step of evaluating electrical characteristics of an evaluation circuit formed on a wafer near a semiconductor memory chip; and a programming process step of programming on said programming circuit information indicating the internal voltage line to be connected to said dummy bit line according to the evaluation result in said wafer test process.

14. The method of fabricating a semiconductor memory according to claim 13, wherein said programming process is a fuse process in which a fuse formed in said programming circuit is blown or unblown.

15. A method of fabricating a semiconductor memory that has real memory cells that hold write data, dummy memory cells that do not hold write data, and a dummy bit line that is connected to said dummy memory cells and connected to any one of internal voltage lines via a switch circuit which operates according to the programmed state of a programming circuit, the method comprising the steps of:

a shipment test process step of determining whether a semiconductor memory chip formed on a wafer is good or bad; and a programming process step of programming on said programming circuit information indicating the internal voltage line to be connected to said dummy bit line according to a failure category of a bad chip judged in said shipment test process.

16. The method of fabricating a semiconductor memory according to claim 15, wherein said programming process is a fuse process in which a fuse formed in said programming circuit is blown or unblown.

* * * * *